(12) United States Patent
Kim

(10) Patent No.: US 7,791,251 B2
(45) Date of Patent: Sep. 7, 2010

(54) BIOMIMETIC ELECTRO-ACTIVE PAPER ACTUATORS

(75) Inventor: Jae-Hwan Kim, Incheon (KR)

(73) Assignee: Inha-Industry Partnership Institute, Incheon (KR)

( * ) Notice: Subject to any disclaimer, the term of this patent is extended or adjusted under 35 U.S.C. 154(b) by 174 days.

(21) Appl. No.: 11/851,783

(22) Filed: Sep. 7, 2007

(65) Prior Publication Data

US 2008/0061656 A1 Mar. 13, 2008

Related U.S. Application Data

(63) Continuation-in-part of application No. PCT/KR2005/002176, filed on Jul. 7, 2005.

(30) Foreign Application Priority Data

Mar. 17, 2005 (KR) .................. 10-2005-0022169

(51) Int. Cl.
*H01L 41/04* (2006.01)
*H01L 41/16* (2006.01)
*H02N 2/00* (2006.01)

(52) U.S. Cl. .............. 310/328; 310/330; 310/800

(58) Field of Classification Search .......... 310/328, 310/330, 800

See application file for complete search history.

(56) References Cited

U.S. PATENT DOCUMENTS 6,583,533 B2 6/2003 Pelrine et al.
6,664,718 B2 12/2003 Pelrine et al.
7,307,589 B1 * 12/2007 Gregoire et al. ....... 343/700 MS
2008/0213567 A1 * 9/2008 Park et al. ................ 428/323
2009/0237093 A1 * 9/2009 Kim et al. ................ 324/637

OTHER PUBLICATIONS

Deshpande, SD et al. Sudies on conducting polymer electroactive paper actuators: effect of humidity and electrode thickness; Institute of Physics Publishing; Smart Materials and structures 14 (Jul. 28, 2005) p. 876-880.*
Kim, J. et al., Discovery of Cellulose as a Smart Material, Macromolecules, May 2006, 39 (12), pp. 4202-4206.*
Bar-Cohen, Electroactive Polymers (EAP) As Actuators For Potential Future Planetary Mechanisms. 6th NASA/DoD Conference On Evolvable Hardware (EH-2004), Seattle Washington, Jun. 24, 2004.

* cited by examiner

*Primary Examiner*—J. SanMartin
(74) *Attorney, Agent, or Firm*—Marsh Fischmann & Breyfogle LLP

(57) ABSTRACT

This invention relates to biomimetic electro-active paper actuators which are ultra lightweight, have a large deformation feature, are operated with low power consumption, are remotely driven by microwaves, and have suitable response speed, which are comprised of paper wherein micro fibrils of cellulose are arranged in a predetermined direction, electrodes which are deposited on both sides of the paper, a film rectenna which receives an electric field from outside and converts it into direct power, and a PAD logic circuit (power allocation & distribution) which receives a signal of direct power and converts/controls it into power force.

2 Claims, 4 Drawing Sheets

BIOMIMETIC ELECTRO-ACTIVE PAPER ACTUATORS

CROSS-REFERENCE TO RELATED APPLICATIONS

This is a continuation-in-part of International Application PCT/KR2005/002176, with an international filing date of Jul. 7, 2005, which claims priority to Korean Application No. 10-2005-0022169, filed Mar. 17, 2005. Each of these applications is incorporated herein by reference in its entirety.

BACKGROUND OF THE INVENTION

1. Field of the Invention

The present invention relates to biomimetic electro-active paper actuators, which are ultra light, have a large deformation feature, are operated with low power consumption, are remotely driven by microwaves and have suitable response speed, and also relates to a method thereof.

2. Description of the Prior Art

Industrial interest in electro-active polymers (EAP) has increased because of the possibility of artificial muscles as functional materials capable of deforming largely. EAP has flexibility like a muscle as well as it can be deformed largely by outer stimulation, and has features and functions that other materials do not. EAP creates applications of artificial muscle actuators such as for next generation robots, applications in the entertainment industry or the actuators of a micro air plane. The application of EAP actuators is broad, and provides utility to many industry fields. However, since the EAPs developed until now have limited function, new EAP materials development is essential. There are many problems with EAP that need to be solved, including operation force increase, more rapid response, lower power consumption, and improved durability etc. Particularly, in ultra light EAP actuators, power supplying is very important when it is associated with the application device.

Generally EAP is classified according to operating principle as either electronic EAP or ionic EAP:

1. Electronic EAP: Dr. Zhang of Pennsylvania University has obtained remarkable piezoelectric phenomenon from an electronic radiated P (VDF-TrFE) copolymer. When 150 V/μm is applied at low frequency into the copolymer, about 4% piezoelectric deformation rate can be obtained and it has an elasticity constant of more than 1 GPa. However, disadvantages are high production cost because of the irradiation usage and the need for a high actuation voltage. This is used in acoustic transducer development to be used in medical probing apparatus, underwater acoustic devices, stereo speakers and the like. SRI International has developed EAP actuators based on electrostictive response of dielectric elastomers covered with a flexible electrode in the presence of an electric field. Double bow-tie or roll typed linear actuators using acryl film were utilized in the artificial muscle of biomimetic robots such as a 6-axials walking robot, a flapping wing of a micro air plane and the like. However, there are disadvantages that high voltage of about 200 V/μm must be applied and pre-strain must be given in lengthwise. NASA Langley research center has developed a piezoelectric polymer of grafted elastic copolymer that has a deformation rate of about 4% and a high physical elasticity constant of 560 MPa at 140 V/μm. The grafted elastic copolymer comprises grafted polymer composing crystal in backbone having flexibility. A problem these electronic EAPs have is that they need a high operating voltage, resulting in that there are many difficulties in voltage breakdown, packaging, miniaturization, device design and implementation.

2. Ionic EAP: An ionic polymer gel is capable of being fabricated into actuators exhibiting force and energy density similar to human muscles. Calvert of Arizona University made an actuator capable of operating like muscle by stacking cross-linked poly acryl amide and polyacrilic acid hydrogel alternately between electrodes. It is bent according to electric field when hydrogel is placed on water between two electrodes. However, since this multilayer ionic gel structure needs time for the ion to be diffused into the gel, the response is slow. Ionomeric polymer-metal composites (IPMC) are ionic EAP where the polymer net is bent by cation migration at the electric field applied. Many researchers including Oguro of Advanced Institute of Science and Technology in Japan, Shahinpoor of New Mexico University etc. have investigated the operating principle and functions of IPMC. By using IPMCs, demonstrations have been made such as a dust wiper, a gripper, a non-noise swimming robot, an active catheter, a cilium-like assembled robot, an artificial tactile system similar to coral reef, and the like. Conducting polymer (CP) is operated by reversible counter-ion charge and discharge generated during the redox cycle. Actuators using CP have been developed in many countries including USA, Japan, Australia, Italy, Spain etc, and bilayer structures and trilayer structures have been developed with a stack of CP films and an elastic film without volume deformation. Sweden Linkopings University has successfully made a robot arm having an elbow, wrist and 2-4 fingers able to be separately controlled by using a conducting polymer actuator, and to move a 0.1 mm glass ball about 0.25 mm distance. The actuator using single-walled carbon nanotubes generates more strain than that of natural muscle and higher deformation than ferroelectrics having a high elasticity constant. Macro SWNT actuator such as natural muscle is a type wherein several billion nanotubes are combined, and long durability can be achieved because of not needing ion exchange which reduces lifetime, and because it is operated at low voltage. These ionic EAPs have disadvantages that operating speed is slow and there must be an electrolyte and water present while having the advantage that the operating voltage is low.

As described above, electronic EAPs developed until now have rapid response and large deformation rate but need a high operating voltage, while ionic EAPs can be deformed at low operating voltage and have elasticity like muscle but response speed is low and wetness should be kept.

On the other hand, in applications needing ultra light and large deformation features such as micro crawling robots, micro air planes, and animatronic devices, the above-mentioned requirements are essential. For applications needing ultra light and large deformation features, EAP needs rapid response, low power consumption, and good durability. Particularly, since an ultra lightweight EAP application device cannot carry power batteries, it is desirable to use a remote power source for reducing the weight as well as minimizing the power consumption. If a remote power source is used, EAP applications can be broadened due to the device being lighter, lower power consumption and improved performance.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

The present invention is proposed for solving the above mentioned problems, and for providing ultra lightweight biomimetic electro-active paper (EAPap) actuators having a large deformation rate, low energy consumption, rapid response, durability and remote controllability. And the present invention provides an operating method of the actuator that includes microwave power transmission.

According to the present invention, the paper actuator is made of paper comprising cellulose, wherein the paper is made by arranging micro fibrils in a predetermined orientation and disposing electrodes on the paper. Therefore, the actuator is deformed when an electric field is applied.

In these functional materials, it is very important that the paper is made by aligning micro fibrils of cellulose in a predetermined direction. For implementing the paper, a cellulose solution is prepared by dissolving cellulose pulp using solvents like a strong alkali, and then micro fibrils are aligned in a predetermined direction by the use of centrifugal force of spin-coating, by stretching them with external force, or by applying electric fields or magnetic fields.

Figure 1:
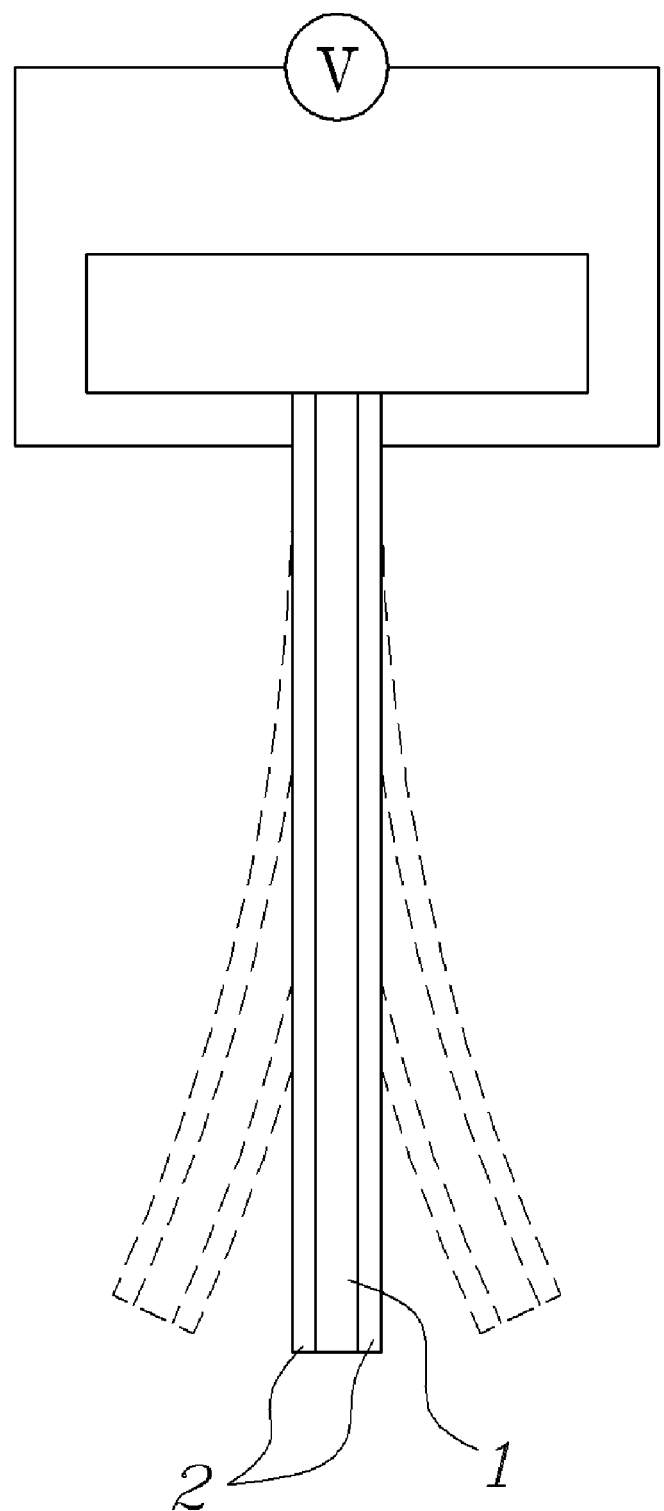
FIG. 1 is a schematic diagram showing an electro-active paper actuator in a state of being bent by an electric field, wherein electrodes are disposed on both sides of the cellulose paper.
Figure 2:
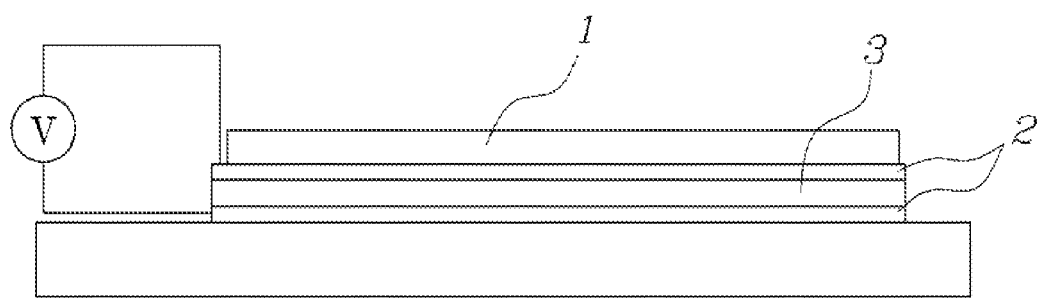
FIG. 2 is a schematic diagram showing another state of an electro-active paper actuator being deformed in a lengthwise direction, wherein the cellulose paper is disposed in a plane.

Various deformations can be obtained according to the method of depositing electrodes on the paper, and examples are shown in FIGS. 1-2. FIG. 1 illustrates a bending deformation occurring in a state that conducting electrodes (2) are deposited on both sides of the paper (1), one end of the paper being fixed, and an electric field is applied. FIG. 2 illustrates lengthwise deformation occurring in another state that paper having two electrodes (2) are deposited on a plane (3) and an electric field is applied.

Regarding the detailed operating principle, the crystalline regions including ordered parts and disordered regions of cellulose fibrils are deformed by the piezoelectric effect and the ionic migration effect with an applied electric field. When micro fibrils are aligned in a specific direction, the piezoelectric effect occurs due to the crystal structure in the ordered cellulose regions. It is well known that trees and cellulose have a piezoelectric effect. Meanwhile, paper is known as an ionic conductor. In a paper production process, metal ions can be dissolved into the pulp during paper processing and water molecules can be included in the paper as absorbed water or free water molecules. These ions and water molecules migrate to the cathode or anode according to the applied electric field, resulting in that deformation occurs.

Figure 3:
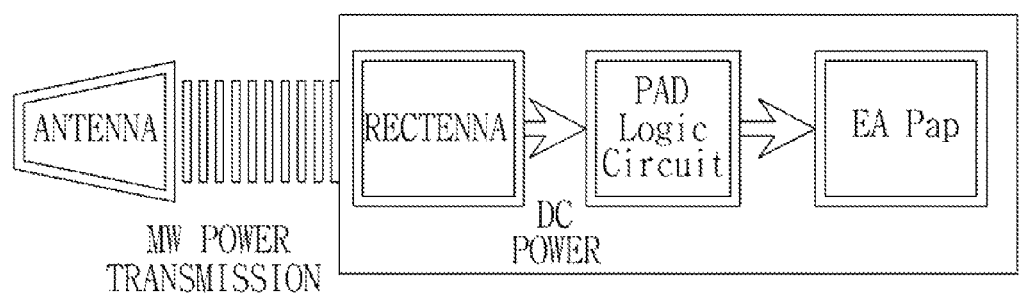
FIG. 3 is a block diagram showing a biomimetic electro-active paper actuator according to the present invention.
Figure 4:
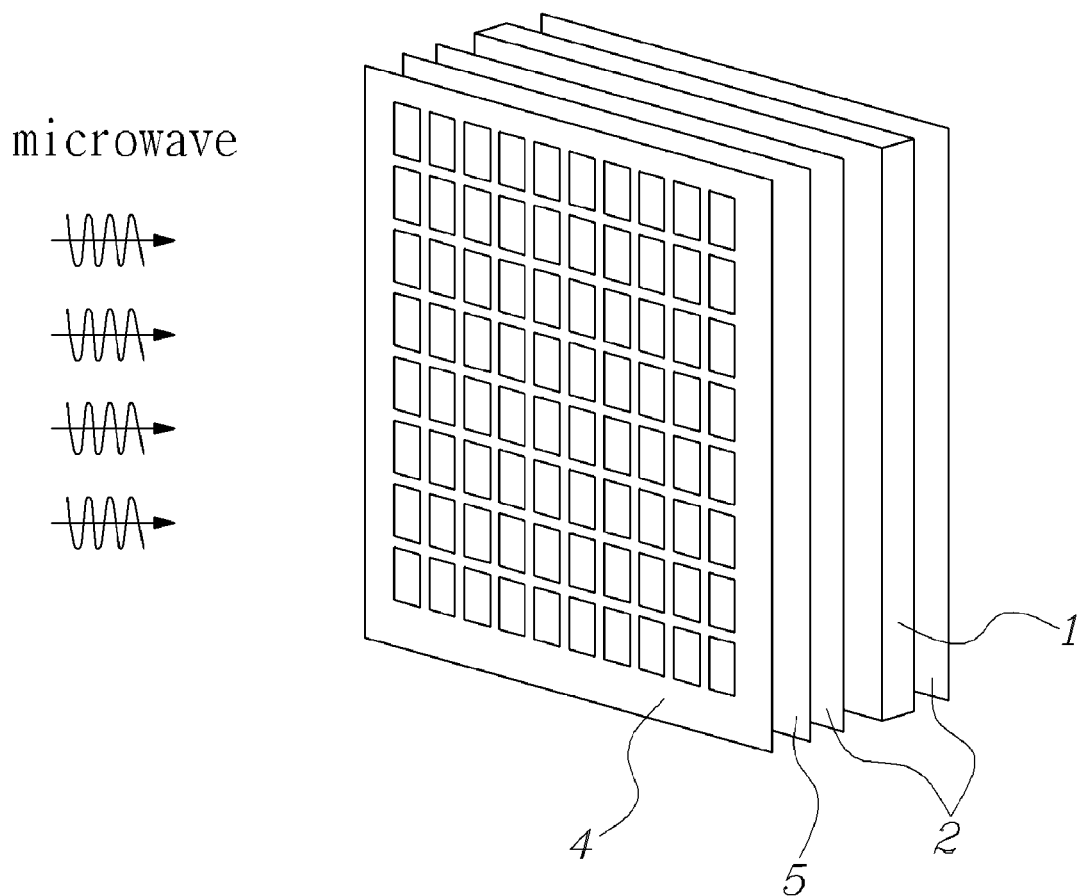
FIG. 4 is a perspective view showing an electro-active paper actuator according to an embodiment of the present invention.
Figure 5:
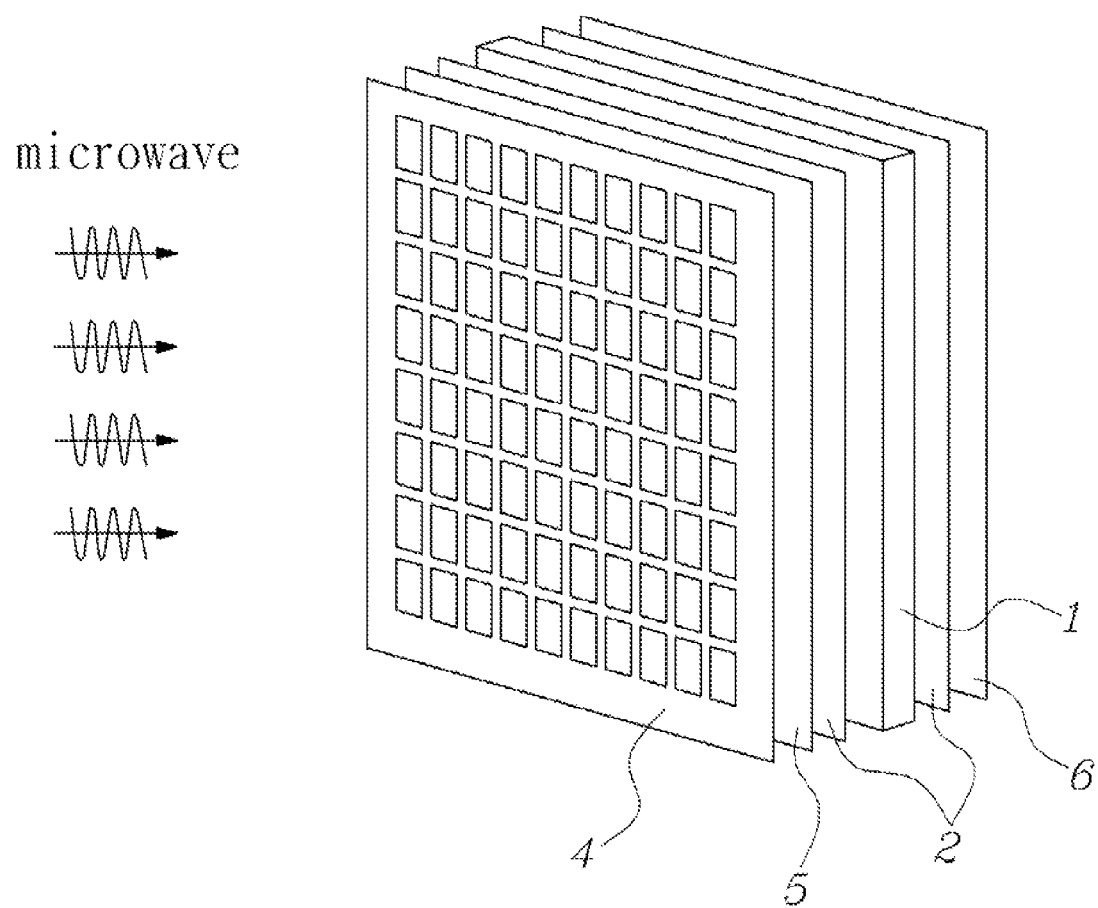
FIG. 5 is a perspective view showing an electro-active paper actuator according to another embodiment of the present invention.

A microwave remote principle is shown FIGS. 3-5. When microwaves arrive at the rectenna (4), the rectenna (4) converts the received microwaves into dc power. There are many types of rectennas, e.g., patch type and dipole type, and both can be used. Since the size of rectenna (4) varies according to frequency, rectenna size decreases with frequency and can be arranged in a specific direction. Further, a rectenna can be integrated with an EAPap actuator because it has a thin film shape. In a dipole rectenna, microwaves are converted into dc power, and the signal is applied into EAPap actuator through power conversion/control circuit of power allocation & distribution (PAD) logic circuit. PAD (5) implements the principle by supplying power when horizontal and vertical directional signals are all given using a dual gate MOSFET. Further, a thin film battery layer (6) can be used by associating with the actuator such as when microwaves are not transmitted. At this time, since the electrodes are deposited separately on both sides of EAPap, the deformation of the paper actuator can be controlled by controlling the applied voltage. This method is an operation method for ultra lightweight actuator that overcomes the limitations of the prior art, and therefore it can make an EAPap actuator that is ultra lightweight and can be utilized in various industrial fields. This remote operation is practical because the required electrical power for the EAPap actuator is as low as the microwave power threshold that does not harm human beings. Since a power battery to operate the device is not needed any more, an ultra lightweight remote operating EAPap can be implemented as indicated in FIG. 4.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A biomimetic electro-active paper actuator comprising:
   paper wherein micro fibril of cellulose are aligned in a specific direction,
   electrodes deposited on both sides of the paper,
   a thin film rectenna for converting received microwaves into dc power for driving the actuator, and
   a power allocation and distribution logic circuit for converting/controlling the received signal of dc power.

2. The biomimetic electro-active paper actuator in claim 1, further comprising a thin film battery layer associated with the actuator.

\* \* \* \* \*